United States Patent
Hashimoto et al.

(10) Patent No.: US 10,958,250 B2
(45) Date of Patent: Mar. 23, 2021

(54) SEMICONDUCTOR DEVICE

(71) Applicant: Renesas Electronics Corporation, Tokyo (JP)

(72) Inventors: Chiemi Hashimoto, Tokyo (JP); Kosuke Yayama, Tokyo (JP); Katsumi Tsuneno, Tokyo (JP); Tomokazu Matsuzaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 4 days.

(21) Appl. No.: 16/004,014

(22) Filed: Jun. 8, 2018

(65) Prior Publication Data
US 2018/0375497 A1 Dec. 27, 2018

(30) Foreign Application Priority Data
Jun. 27, 2017 (JP) .............................. JP2017-125211

(51) Int. Cl.
*H01L 21/00* (2006.01)
*H03K 3/011* (2006.01)
(Continued)

(52) U.S. Cl.
CPC .......... *H03K 3/011* (2013.01); *H01L 23/5226* (2013.01); *H01L 23/5228* (2013.01);
(Continued)

(58) Field of Classification Search
CPC .............. H01L 23/5226; H01L 23/5228; H01L 27/0802; H01L 28/20; H01L 23/53266;
(Continued)

(56) References Cited

U.S. PATENT DOCUMENTS 6,291,305 B1 * 9/2001 Huang ................... H01L 21/64
438/381
2012/0161868 A1 6/2012 Yayama et al.
(Continued)

FOREIGN PATENT DOCUMENTS

JP 2004-040009 A 2/2004
JP 2008-277686 A 11/2008
(Continued)

OTHER PUBLICATIONS

Machine translation for JP 2008-277686, 4/20.*
(Continued)

*Primary Examiner* — Richard A Booth
(74) *Attorney, Agent, or Firm* — McGinn IP Law Group, PLLC

(57) ABSTRACT

A polycrystalline silicon resistor is large in coefficient of fluctuation in resistance between before and after the completion of a package molding process. To enable highly accurate trimming, it is desired to implement a resistor that is hardly subjected to stress produced in a substrate during a package molding process. A resistance element is formed of a plurality of wiring layers and has a repetitive pattern of a first conductive layer formed in a first wiring layer, a second conductive layer formed in a second wiring layer, and an interlayer conductive layer coupling the first conductive layer and the second conductive layer together.

18 Claims, 11 Drawing Sheets

(51) Int. Cl.
  *H01L 23/522* (2006.01)
  *H01L 27/08* (2006.01)
  *H01L 49/02* (2006.01)
  *H03K 3/356* (2006.01)
  *H01L 23/532* (2006.01)

(52) U.S. Cl.
  CPC .......... *H01L 27/0802* (2013.01); *H01L 28/20* (2013.01); *H03K 3/356113* (2013.01); *H01L 23/53266* (2013.01); *H01L 23/53271* (2013.01)

(58) Field of Classification Search
  CPC .............. H01L 23/53271; H03K 3/011; H03K 3/356113
  See application file for complete search history.

(56) References Cited

U.S. PATENT DOCUMENTS

| 2013/0285207 A1 | 10/2013 | Maeda et al. |
| 2014/0054746 A1 | 2/2014 | Ohtake |

FOREIGN PATENT DOCUMENTS

| JP | 2012-138870 A | 7/2012 |
| JP | 2013-143521 A | 7/2013 |
| JP | 2013-229509 A | 11/2013 |
| JP | 2014/158033 A | 8/2014 |
| WO | WO 00/77849 A1 | 12/2000 |

OTHER PUBLICATIONS

Machine translation for JP 2013-143521, 4/20.*
Notice of Reasons for Refusal dated Aug. 25, 2020, in Japanese Patent Application No. 2017-125211 with an English translation.
European Search Report dated Oct. 29, 2018, in European Patent Application No. 18178761.5.
European Office Action dated Sep. 24, 2020, in European Patent Application No. 18178761.5.

* cited by examiner

SEMICONDUCTOR DEVICE

CLAIM OF PRIORITY

The present application claims priority from Japanese patent application JP 2017-125211 filed on Jun. 27, 2017, the content of which is hereby incorporated by reference into this application.

FIELD OF THE INVENTION

The present invention relates to a semiconductor device with a trimming circuit using a resistance element.

BACKGROUND OF THE INVENTION

When a semiconductor device is provided with an oscillation circuit, in general, a trimming circuit is provided for trimming the frequency characteristics of the oscillation circuit. The trimming circuit includes a resistor and an oscillating frequency of the oscillation circuit can be set to a desired value on a semiconductor device (chip)-by-semiconductor device (chip) basis by adjusting a resistance value of the resistor. As a resistance element used in trimming circuits, there is known a polycrystalline silicon resistor used to forma circuit element such as a transistor. A polycrystalline silicon resistor can be formed without complicating a semiconductor device manufacturing process and is excellent in that it is high in resistivity and a high resistance can be achieved with a small area; however, it is known that its resistance value fluctuates after a package molding process. This fluctuation in resistance value is caused by a change in shape, a piezoelectric effect, or the like as the result of a resistance element (polycrystalline silicon resistor) on a silicon chip being subjected to stress from mold resin. In the technology disclosed in Japanese Unexamined Patent Application Publication No. 2013-229509 (Patent Document 1), a location where a polycrystalline silicon resistor is to be placed is specified so as to reduce stress the polycrystalline silicon resistor is received from mold resin as much as possible.

SUMMARY OF THE INVENTION

The technology in Patent Document 1 aims to suppress a coefficient of fluctuation in resistance of a polycrystalline silicon resistor between a state of wafer (completion of trimming) and the completion of a package molding process to within approximately ±0.5%. However, in recent years, higher accuracy has been required of trimming circuits and it is preferable to lower a coefficient of fluctuation in resistance as much as possible. Further, in the technology disclosed in Patent Document 1, a location where a polycrystalline silicon resistor can be placed is limited and a degree of freedom in designing is inevitably degraded.

Other problems and novel features will be apparent from the description in the present specification and the accompanying drawings.

As a resistance element suitable for trimming circuits, a resistance element which is formed in a plurality of wiring layers and has main resistance in a direction perpendicular to a semiconductor substrate plane is implemented.

A resistor low in coefficient of fluctuation in resistance after the completion of a package molding process can be implemented.

DETAILED DESCRIPTION OF THE PREFERRED EMBODIMENTS

Figure 1:
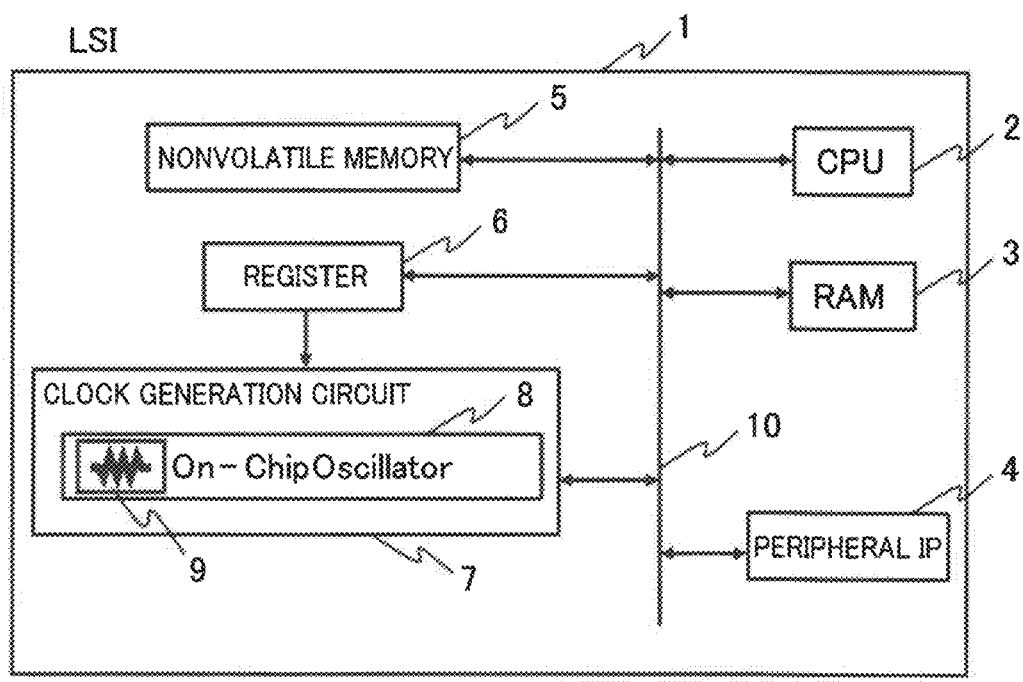
FIG. 1 is a block diagram of a semiconductor device.

Hereafter, a description will be given to an embodiment of the present invention with reference to the drawings. FIG. 1 is a block diagram illustrating a semiconductor device 1 in the present embodiment. Active elements, such as a transistor, and passive elements, such as a resistor and a capacitor, are formed on a substrate of the semiconductor device 1. In the semiconductor device 1, various functional blocks are formed using these elements. FIG. 1 shows CPU (Central Processing Unit) 2, RAM 3, a peripheral IP 4, and a nonvolatile memory 5 as examples of functional blocks. An example of the peripheral IP is an A/D converter. Addresses and data are communicated between these functional blocks via a bus 10. A clock generation circuit 7 generates a clock from an oscillation signal of an on-chip oscillator 8 and distributes the clock to these functional blocks. The on-chip oscillator 8 includes a resistor 9. A resistance value of the resistor 9 is adjusted to a predetermined value and an oscillating frequency of the on-chip oscillator 8 is set to a desired value on a semiconductor device 1-by-semiconductor device 1 basis. A trimming code required for trimming is written to the nonvolatile memory 5 or the RAM 3 and a resistance value of the resistor 9 is adjusted to a predetermined value based on a trimming code read through a register 6.

Figure 2:
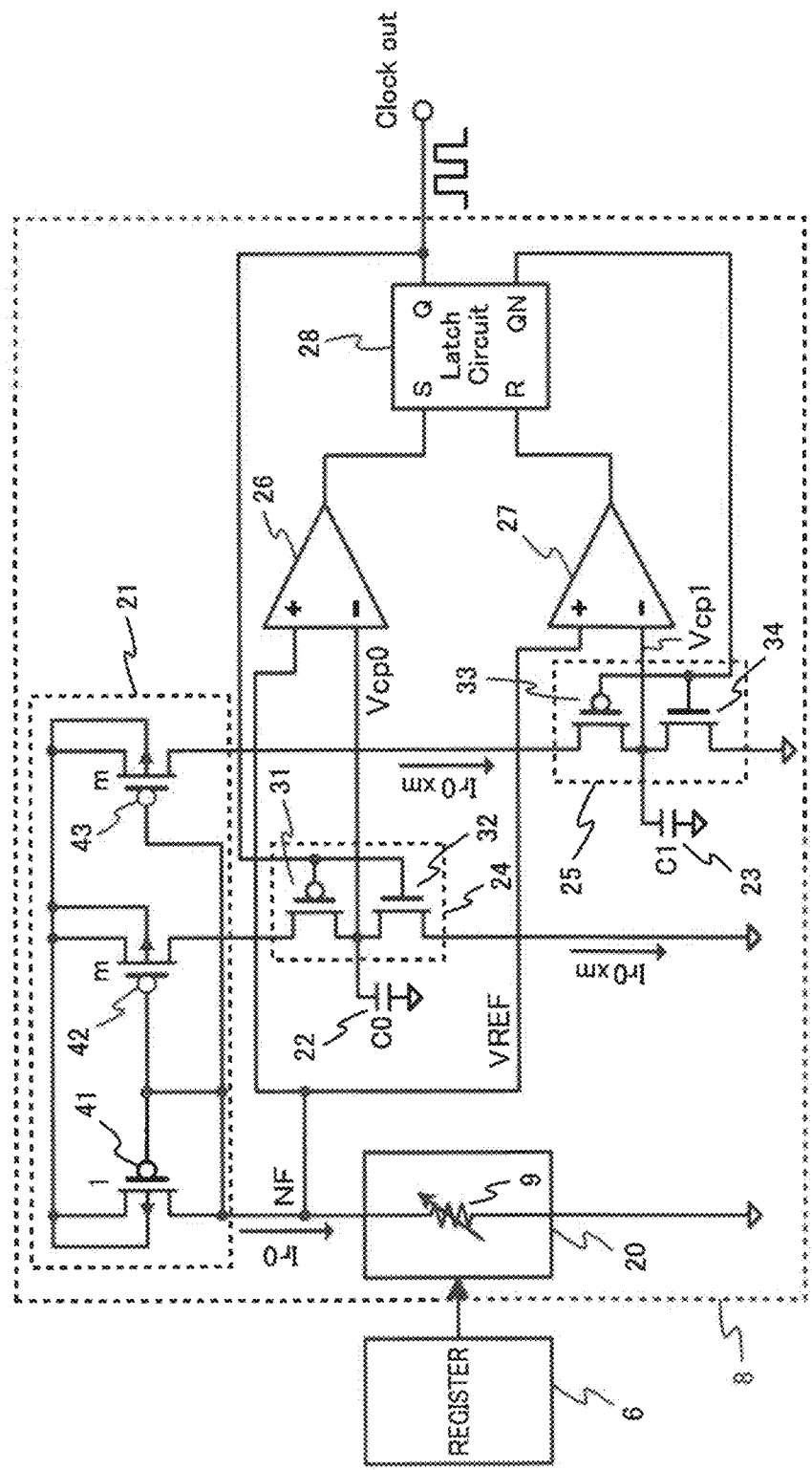
FIG. 2 is a circuit diagram of an oscillation circuit.

FIG. 2 is a circuit diagram of an oscillation circuit as an example of the on-chip oscillator 8. The oscillation circuit includes a trimming circuit 20, a constant-current generation circuit 21, capacitors 22, 23, capacitance drive circuits 24, 25, comparators 26, 27, and a latch circuit 28. The capacitance drive circuit 24 includes a PMOS transistor 31 and an NMOS transistor 32 whose source-drain paths are coupled in series. The source of the NMOS transistor 32 is coupled to a grounding terminal and the drain thereof is coupled to the drain of the PMOS transistor 31. A junction of the drain of the PMOS transistor 31 and the drain of the NMOS transistor 32 is an output node of the capacitance drive circuit 24 and a capacitor 22 is coupled thereto. The source of the PMOS transistor 31 is fed with an output current Ir0×m outputted by the constant-current generation circuit 21. A current passed through the source-drain path of a PMOS transistor 41 of the constant-current generation circuit 21 is Ir0 and the transistor size of a PMOS transistor 42 (43) of the constant-current generation circuit 21 is m times the transistor size of the PMOS transistor 41. For this reason, the output current Ir0×m is inputted to the source of the PMOS transistor 31. The gate of the PMOS transistor 31 and the gate of the NMOS transistor 32 are coupled in common and an output signal Q of the latch circuit 28 is inputted thereto. The capacitor 22 is coupled between the output node of the capacitance drive circuit 24 and the grounding terminal and as a result, a voltage corresponding to an amount of charge accumulated in the capacitor 22 is produced at the output node of the capacitance drive circuit 24. This is the same with the capacitance drive circuit 25, which has a capacitor 23 coupled to an output node thereof. Though a detailed description will be omitted, the gate of a PMOS transistor 33 and the gate of an NMOS transistor 34 are coupled in common and an output signal QN of the latch circuit 28 is inputted thereto.

An oscillation reference voltage $V_{REF}$ is inputted to the non-inverting input terminal (+) of the comparator 26 and an output node voltage $V_{CP0}$ of the capacitance drive circuit 24 is inputted to the inverting input terminal (−) thereof. The comparator 26 switches a logic level of a set signal S according to which is higher, the oscillation reference voltage $V_{REF}$ or the output node voltage $V_{CP0}$. Specifically, the comparator 26 brings a set signal S to a high level when the output node voltage $V_{CP0}$ is higher than the oscillation reference voltage $V_{REF}$ and brings a set signal S to a low level when the output node voltage $V_{CP0}$ is lower than the oscillation reference voltage $V_{REF}$. This is the same with a comparator 27 that switches a logic level of a reset signal R. Though a detailed description will be omitted, the oscillation reference voltage $V_{REF}$ is inputted to the non-inverting input terminal (+) of the comparator 27 and an output node voltage $V_{CP1}$ of the capacitance drive circuit 25 is inputted to the inverting input terminal (−) thereof.

It is preferable that the comparator 26 (27) should be a hysteresis comparator in order to stably switch a logic level of a set signal S (reset signal R). When dh is taken as a hysteresis width, the hysteresis comparator switches a set signal S (reset signal R) from a low level to a high level when the output node voltage $V_{CP0}$ ($V_{CP1}$)> the oscillation reference voltage $V_{REF}$ and switches a set signal S (reset signal R) from a high level to a low level when the output node voltage $V_{CP0}$ ($V_{CP1}$)+dh< the oscillation reference voltage $V_{REF}$.

The resistor 9 is coupled in series with the source-drain path of the PMOS transistor 41 of the constant-current generation circuit 21. A resistance value of the resistor 9 is adjusted by the trimming circuit 20. The trimming circuit 20 is fed with a trimming code stored in the register 6. A resistance value of the resistor 9 is adjusted according to a trimming code and an amount of current Ir0 passed through the source-drain path of the PMOS transistor 41 is thereby adjusted. As a result, a frequency of an outputted clock is adjusted.

Figure 3:
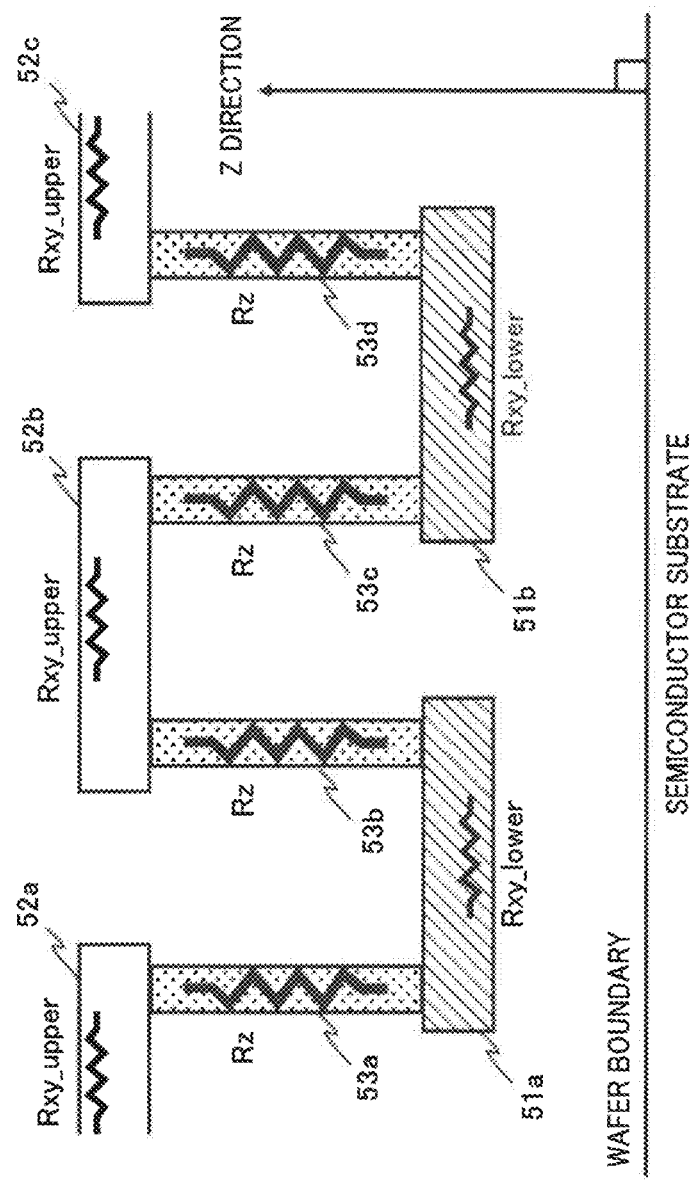
FIG. 3 is a conceptual rendering of a resistance element.

FIG. 3 is a conceptual rendering of a resistance element used in the resistor 9 in the present embodiment. The resistance element is formed in wiring layers of a semiconductor device. The surface of the semiconductor substrate where a semiconductor element is formed is taken as an XY plane and a direction perpendicular to the XY plane is taken as a Z direction. The resistance element includes: a lower conductive layer 51 and an upper conductive layer 52 extending in an X direction or a Y direction, respectively; and an interlayer conductive layer 53 whose ends are coupled to the lower conductive layer 51 and the upper conductive layer 52, respectively and which is extended in the Z direction. The lower conductive layer 51, the interlayer conductive layer 53, and the upper conductive layer 52 are coupled in series.

Here, it will be assumed that: a resistance value of the resistance element is R and the resistance element includes k+1 lower conductive layers 51, k upper conductive layers 52, and 2 k interlayer conductive layers 53 coupled in series. Further, it will be assumed that a resistance value of one lower conductive layer 51 is Rxy_lower, a resistance value of one upper conductive layer 52 is Rxy_upper, and a resistance value of one interlayer conductive layer 53 is Rz. At this time, a resistance value R of the resistance element is expressed by (Expression 1):

$$R=(k+1)\times Rxy\_lower+2k\times Rz+k\times Rxy\_upper \quad \text{(Expression 1)}$$

This is an expression that holds when the resistance element is coupled with another element at the upper conductive layer 52. Similarly, (Expression 2) holds when the resistance element is coupled with another element at the lower conductive layer 51:

$$R=k\times Rxy\_lower+2k\times Rz+(k+1)\times Rxy\_upper \quad \text{(Expression 1)}$$

Since the Z-direction component of the resistance element is taken as main resistance, the relation expressed by (Expression 3) holds:

$$Rz>Rxy\_lower+Rxy\_upper \quad \text{(Expression 3)}$$

As described later, the resistance element in the present embodiment, which is formed in wiring layers and in which the Z-direction component is taken as main resistance, is hardly influenced by stress produced in the semiconductor substrate as the result of a package molding process. For this reason, a placement position of the resistance element in the present embodiment is not limited; and the lower conductive layer 51, the interlayer conductive layer 53, and the upper conductive layer 52 only have to be coupled in series such that the resistance element has a desired resistance value. In addition, the disposition or number of the individual conductive layers is not limited.

Figure 4:
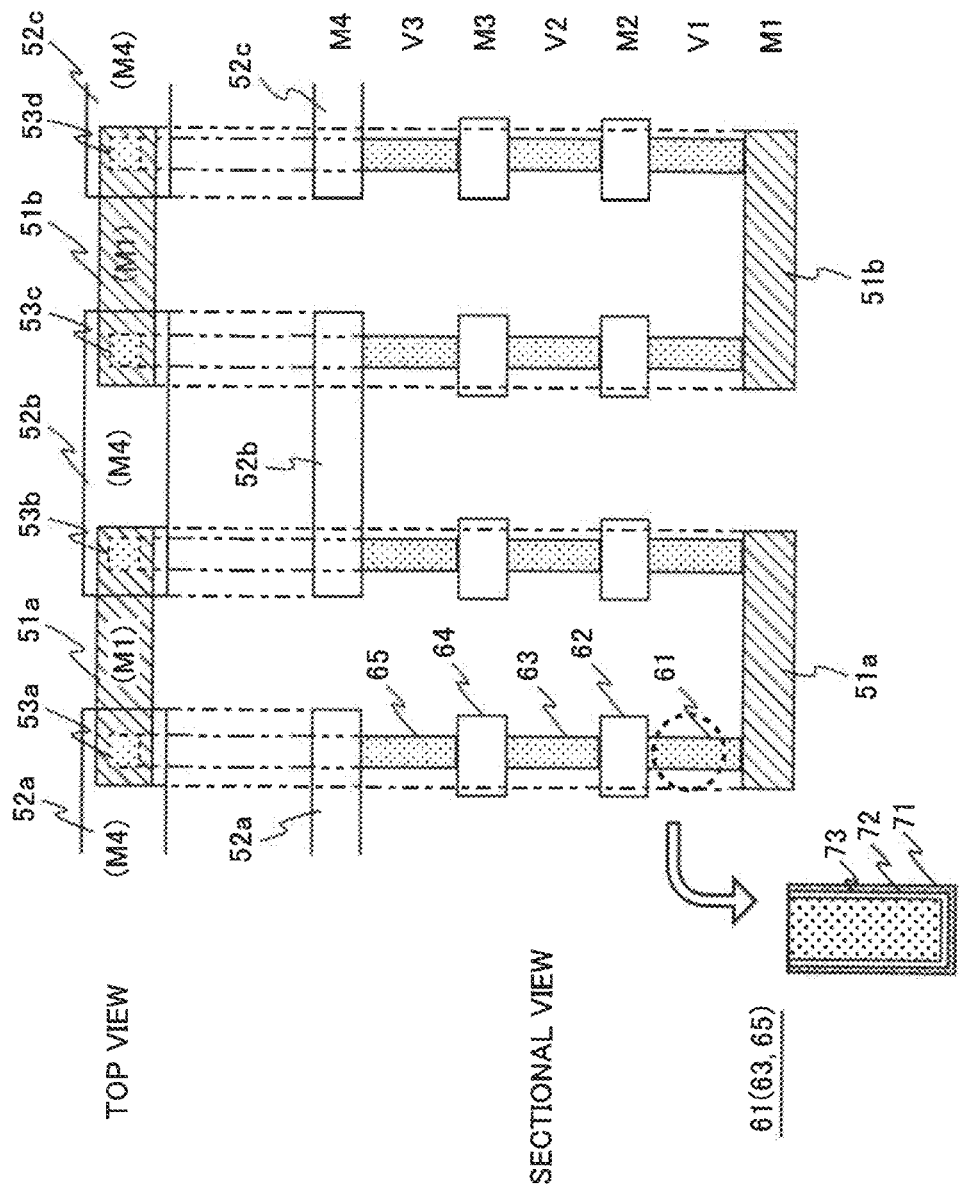
FIG. 4 illustrates an example implementation of a resistance element.

FIG. 4 illustrates an example of implementation of the resistance element. The drawing is a top view and a sectional view illustrating the resistance element in FIG. 3 implemented in a semiconductor device. In the present embodiment, the structure of wiring layers formed in the semiconductor device is utilized for the resistance element. The lower conductive layers 51 are formed of a wiring layer M1; the upper conductive layers 52 are formed of a wiring layer M4; and the interlayer conductive layers 53 are formed of vias V1 to V3 and wiring layers M2, M3. The reason why the interlayer conductive layers 53 are formed of a plurality of conductive layers is that a resistance value of the interlayer conductive layers 53 is made high as much as possible and the interlayer conductive layers are formed by the same process as for ordinary wiring layers. An interlayer conductive layer 53a includes a via 61, a landing PAD 62 formed in the wiring layer M2, a via 63, a landing PAD 64 formed in the wiring layer M3, and a via 65 which are coupled in series. As the result of the interlayer conductive layers 53 being implemented as mentioned above, the resistance element can be formed without adding any change to a wiring process for the semiconductor device.

For example, the wiring layer M1 can be formed of a laminated film of W (main conductive layer)/TiN and the wiring layers M2 to M4 can be formed of a laminated film of TiN/AlCu (main conductive layer)/TiN/Ti. The vias V1 to V3 have a configuration obtained by depositing a Ti layer 71 and a TiN layer 72 and burying a W layer 73 there and a resistance value of the vias depends mainly on a contact resistance between the W layer and the TiN layer. This is just an example. The used wiring layers are not limited to the wiring layers M1 to M4 and this configuration can be implemented by at least two wiring layers and a via buried layer coupling the two wiring layers together. In addition, the via buried layers and the landing PADs formed in the wiring layer M2 and the wiring layer M3 are not limited to the foregoing and any other resistive material such as polysilicon may be adopted. Further, though the vias V1 to V3 are usually formed by burring metal in contact holes formed in an interlayer insulating film, any of the vias V1 to V3 may also be formed by laminating a resistive material such as metal or polysilicon beforehand and filling between the laminated resistive materials with an insulating layer.

Figure 5A:
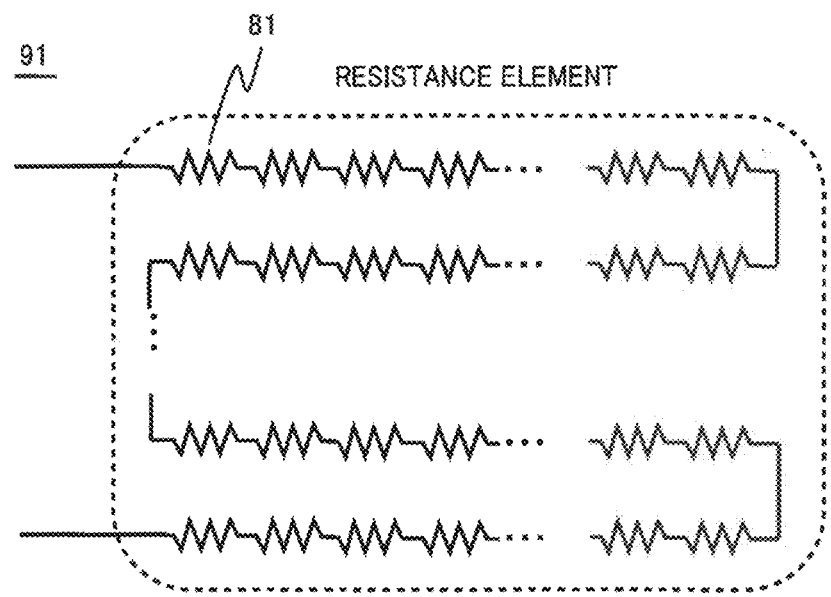
FIG. 5A is a circuit diagram of a resistance element.
Figure 5B:
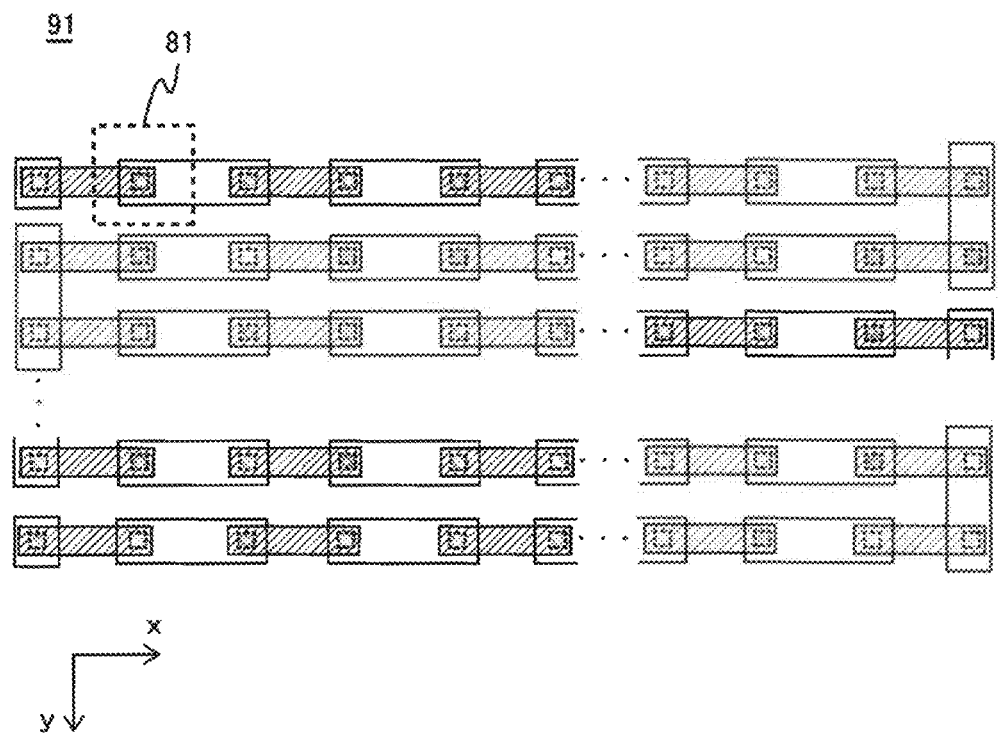
FIG. 5B is a layout (top view) of a resistance element.

Since the resistor 9 in the present embodiment is formed by utilizing a structure of wiring layers as mentioned above, a resistance value of each individual conductive layer constituting the resistance element is relatively low. For this reason, to achieve a desired resistance value, a number of conductive layers coupled in series for the resistance element must be increased. FIG. 5A illustrates a resistance element 91 in the form of circuit diagram. Since the resistance element 91 is formed of a repetitive pattern of lower conductive layers, interlayer conductive layers, and upper conductive layers, this drawing pseudoly depicts one unit of this repetitive pattern as a unit resistor 81. FIG. 5B illustrates the resistance element in FIG. 5A in a layout (top view). Unit resistors coupled in series are continuously Z-folded and compactly disposed. To obtain a resistor having as high resistance as possible with a small area, it is preferable to dispose interlayer conductive layers densely as much as possible. For this reason, in the resistance element in FIG. 5B, the following measure is taken: in an area where the resistance element 91 is formed, vias forming interlayer conductive layers are spread in a matrix pattern in the X direction (in this example, the lengthwise direction of the upper conductive layers and the lower conductive layers is taken as the X direction) and the Y direction; and the interlayer conductive layers are coupled by the lower conductive layers and the upper conductive layers. It is preferable that adjoining interlayer conductive layers should be disposed so as to have the minimum interval of vias prescribed by a layout rule for semiconductor devices (chips). In the example in FIG. 5B, in both the upper conductive layers and the lower conductive layers, the lengthwise direction thereof is taken as the X direction (except an upper conductive layer placed in a folded area). Alternatively, for example, a layout is also acceptable in which the lengthwise direction of the upper conductive layers is taken as the X direction and the lengthwise direction of the lower conductive layers is taken as the Y direction and the conductive layers are coupled in a zigzag pattern and further Z-folded.

Figure 6A:
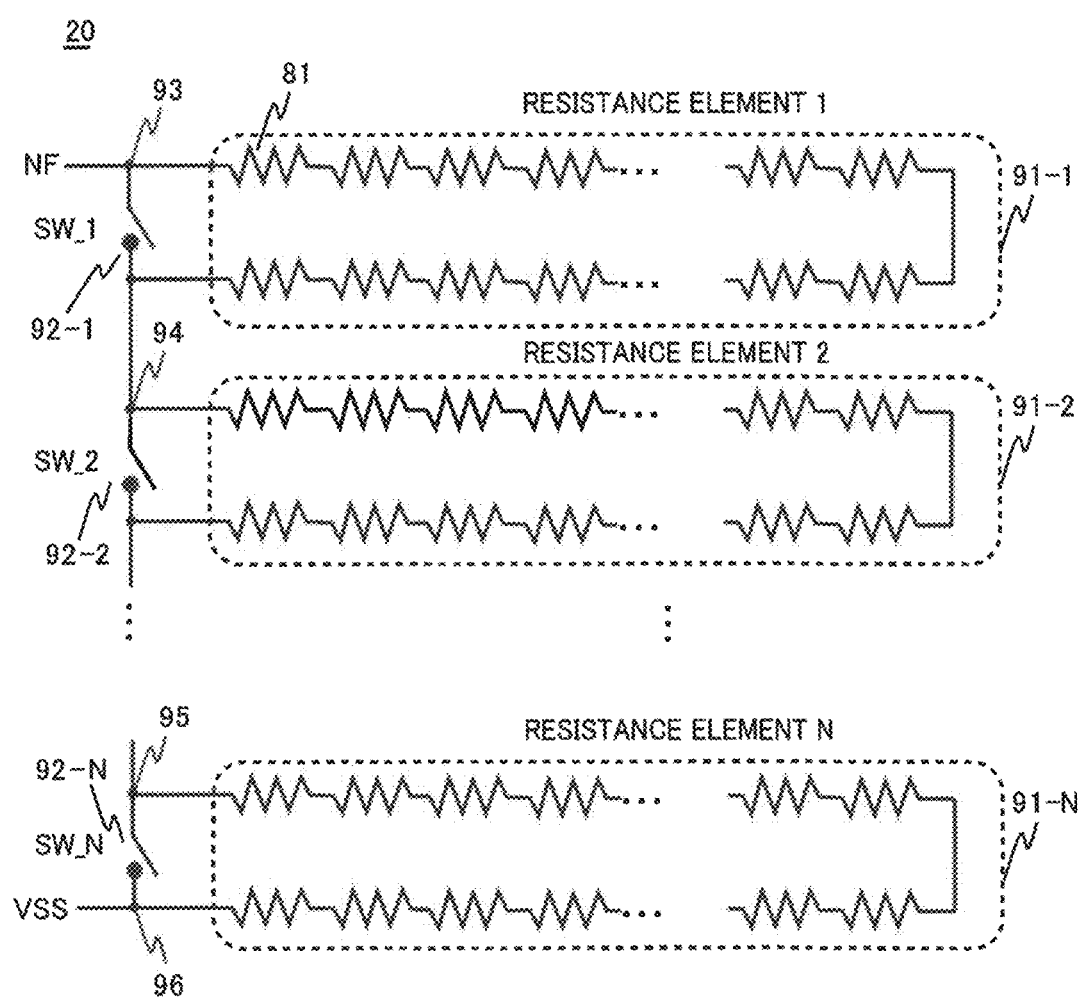
FIG. 6A is a circuit diagram of a trimming circuit using resistance elements.

FIG. 6A is a circuit diagram of a trimming circuit 20 using resistance elements 91 in the present embodiment. The trimming circuit 20 includes: N resistance elements 91 coupled in series; and bypass switches 92-$i$ ($i$=1 to N) provided in parallel with the resistance elements 91-$i$ for bypassing the resistance elements 91-$i$ ($i$=1 to N). Each resistance element 91 includes unit resistors 81 coupled in series as illustrated in FIG. 5A. ON/OFF of each bypass switch 92-$i$ of the trimming circuit 20 is determined according to a trimming code. As a result, resistance of the trimming circuit 20 is set to a desired resistance value and a potential corresponding to the resistance value occurs at a node NF. Since in the resistance element 91 in the present embodiment, there area large number of series couplings, a yield can be degraded due to a failure caused by, for example, disconnection. To cope with this, degradation in yield can be prevented by keeping ON a relevant bypass switch 92-$i$ in a resistance element 91-$i$ in which a manufacturing defect has occurred.

Figure 6B:
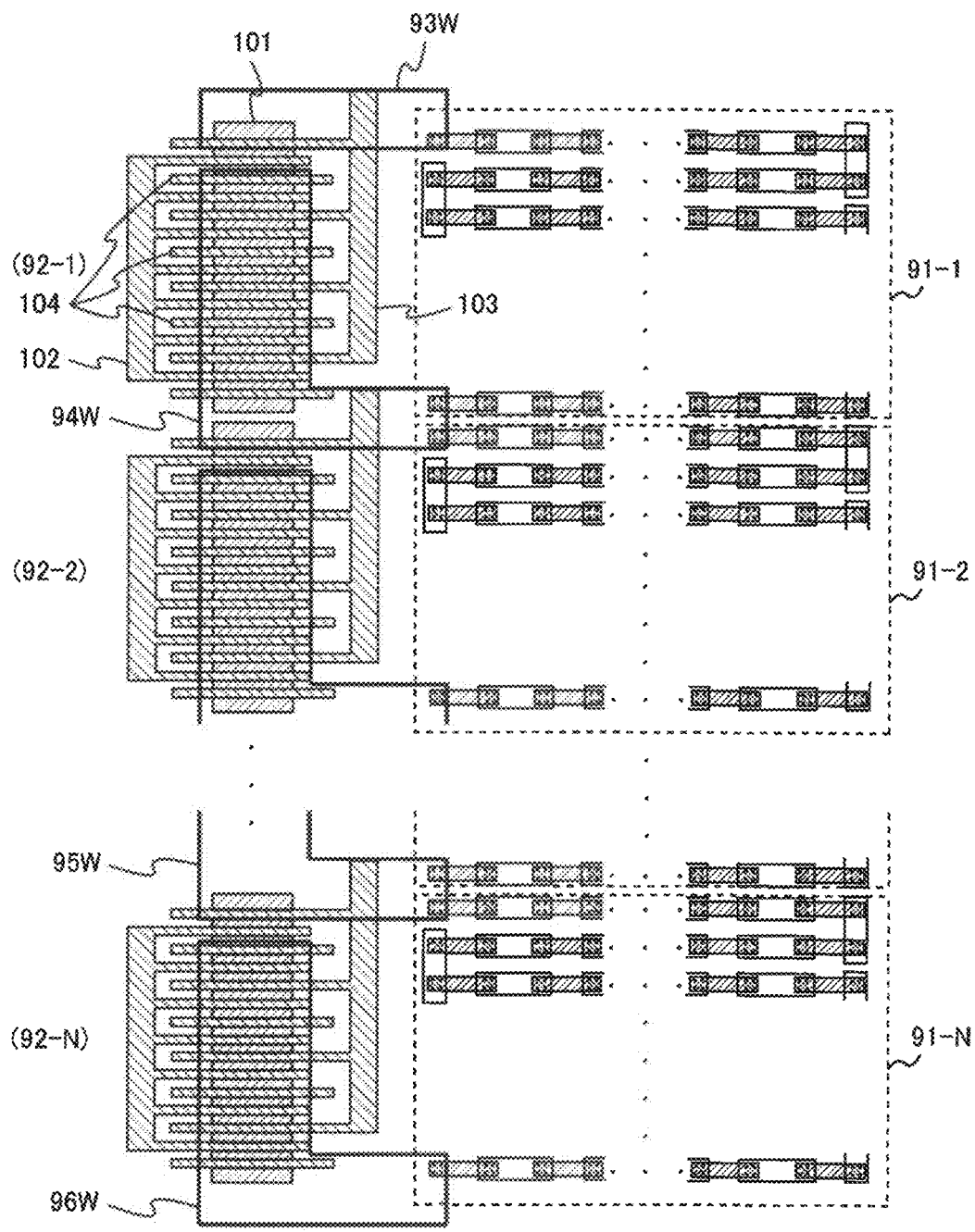
FIG. 6B is a layout (top view) of a trimming circuit.

FIG. 6B is a layout (top view) of the trimming circuit 20 illustrated in FIG. 6A. The layout of the resistance element 91-$i$ ($i$=1 to N) is identical with the layout illustrated in FIG. 5B. Wiring 93W, wiring 94W, wiring 95W, and wiring 96W in FIG. 6B are equivalent to a node 93, a node 94, a node 95, and a node 96 in FIG. 6A, respectively. A configuration of each bypass switch will be described with the bypass switch 92-1 taken as an example. With respect to the bypass switch, it is preferable that the resistance during conduction should be low; therefore, a comb-shaped gate electrode 102 is formed on a diffusion region 101 formed on a semiconductor substrate. A drain electrode 103 is coupled with the wiring 93W via a contact (not shown) and is coupled to a high concentration region (drain region, not shown) of the diffusion region 101. Over the diffusion region 101, meanwhile, a source electrode 104 is disposed in a position opposite the drain electrode 103 with the gate electrode 102 taken as an axis of symmetry and coupled with the wiring 94W via a contact (not shown) and is further coupled to a high concentration region (source region, not shown) of the diffusion region 101.

Figure 7:
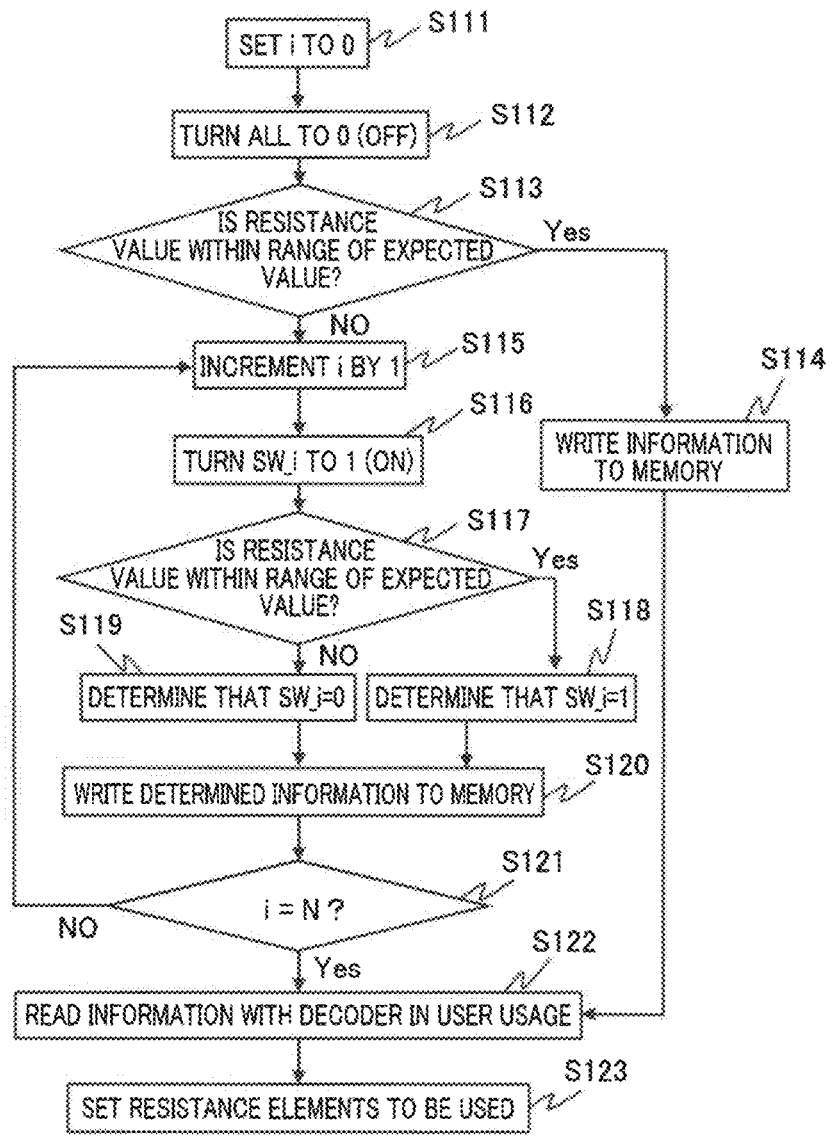
FIG. 7 illustrates a remedial flow.

FIG. 7 illustrates a defect relief flow for the trimming circuit 20. This flow is intended to suppress degradation in yield when there is a resistance element 91 involving a manufacturing defect as mentioned above. This is done by keeping ON a relevant bypass switch 92 to exclude the resistance element from the trimming resistor beforehand. The flow in FIG. 7 is intended to relieve the trimming circuit 20 when there is up to one resistance element involving a manufacturing defect. A control table 110 indicates ON(1)/OFF(0) control on the bypass switch SW_$i$ (1=1 to N) in a $i$-th iteration when, for example, a second resistance element 2 (91-2) of the resistance element 91 is defective. First, $i$ is set to 0 (S111), and at this time, all the bypass switches SW are turned OFF (S112). When a resistance value of the trimming circuit 20 (that is, the sum total of resistance values of the resistance elements 1 to N) is within a range of expected values at this time (S113), information that all the resistance elements 1 to N are normal is written to a memory (S114). Meanwhile, when the sum total of resistance values of the resistance elements 1 to N is out of the range of expected values (S113), it is determined that a defective resistance element is included in the resistance elements 1 to N. Consequently, the value of $i$ is incremented (S115) and the bypass switches SW are turned ON(1)/OFF(0) according to the control table 110 (S116). When a resistance value of the trimming circuit 20 at an $i$-th iteration is within the range of expected values (S117), it is determined that the resistance element $i$ is a defective resistance element and information that the bypass switch SW_$i$ is to be kept ON is written to the memory (S118). The expected values at Step S117 are expected values for the sum total of N−1 resistors and made different from the expected values at Step S113. Meanwhile, when a resistance value of the resistors is still out of the range of expected values (S117), it is determined that the resistance element $i$ is a normal resistance element and information that the bypass switch SW_$i$ is to be turned OFF is written to the memory (S119). The value of $i$ is incremented until the number $i$ of iterations reaches N (S115) and a resistance value of the trimming circuit 20 is repeatedly determined. If there are two or more defective resistance elements, any defective resistance element cannot be identified even after the number $i$ of iterations has reached N; therefore, it can be determined that the trimming circuit 20 is irrelievably defective.

As the result of the flow in FIG. 7, information that a bypass switch corresponding to a resistance element involving a manufacturing defect in the trimming circuit 20 is to be kept ON and a bypass switch corresponding to a normal resistance element is to be kept OFF is stored in the nonvolatile memory or the RAM of the semiconductor device. This information is read in user usage (S122) and normal resistance elements used for trimming can be thereby set (S123).

When a resistance value is within the range of expected values at Step S117 in FIG. 7, it can be seen that only the relevant resistance element i is defective and the flow may be terminated at this stage. A resistance value of each resistance element may also be measured in terms of determination of a respective defect of each resistance element. However, when a defect relief is performed by controlling ON(1)/OFF(0) of the bypass switches as according to the control table 110 in FIG. 7, a defect determination can be made based on resistance values that would be obtained in actual use of the trimming circuit 20 and the reliability of the defect relief flow can be further enhanced.

Figure 8:
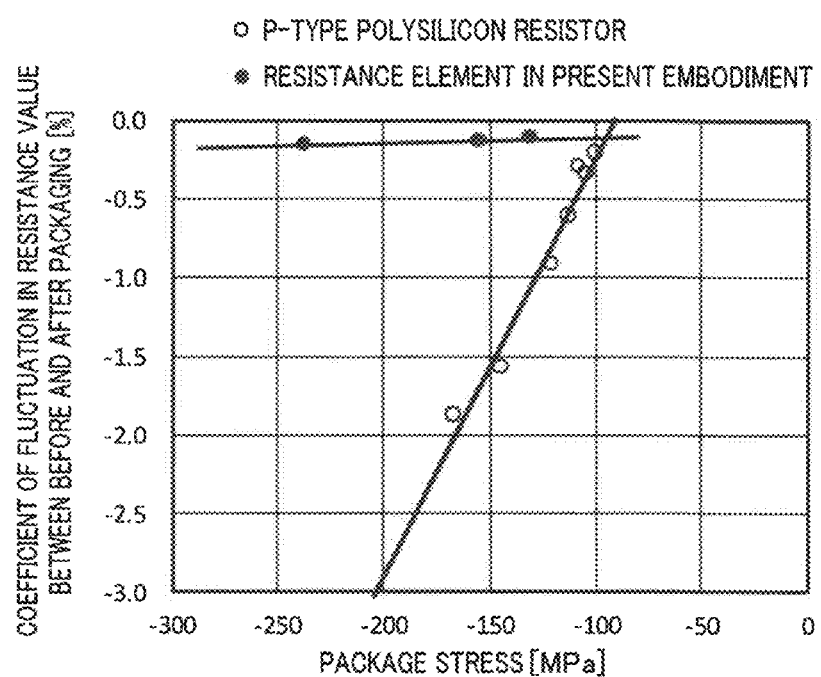
FIG. 8 is a drawing indicating a coefficient of fluctuation in the characteristics of resistance elements versus package stress.

FIG. 8 indicates a coefficient of fluctuation in characteristics against package stress on a resistance element. A filled circle indicates a resistance element in the present embodiment and an open circle indicates a P-type polycrystalline silicon resistor taken as a comparative example. In some packages, as large a stress as 250 MPa or above is applied to the central part of a chip. A resistance element in the present embodiment and a P-type polycrystalline silicon resistor as a comparative example are formed at a plurality of points on each ship and measurements are made. The graph in FIG. 8 indicates results of the measurements and in the graph, the horizontal axis indicates stress produced in a location (substrate) where a resistor is formed and the vertical axis indicates a coefficient of fluctuation in resistance value between before and after packaging. As a result, it is found that in the resistance element in the present embodiment, a coefficient of fluctuation in resistance can be suppressed to below 0.2% wherever it is formed in a chip.

Figure 9:
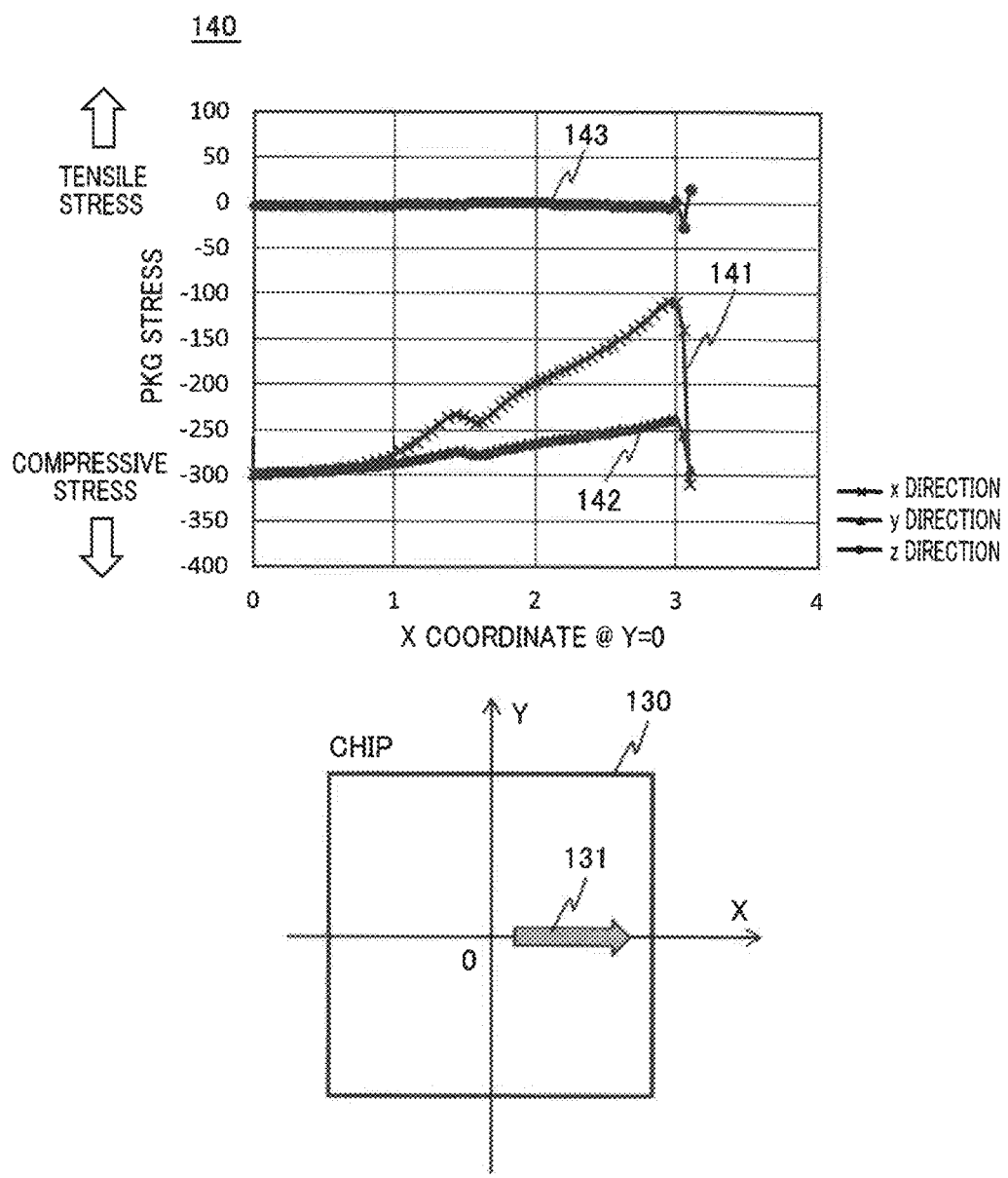
FIG. 9 illustrates an intra-chip distribution of package stress.

FIG. 9 is a graph 140 indicating intra-chip distribution of package stress. In the graph, the center of a chip 130 is taken as the origin and the X-direction package stress, the Y-direction package stress, and the Z-direction package stress produced along an arrow 131 on the X axis from the origin to an edge of the chip as the result of molding are determined by simulation and plotted. In the graph 140, package stress produced in the X direction is indicated by a waveform 141; package stress produced in the Y direction is indicated by a waveform 142; and package stress produced in the Z direction is indicated by a waveform 143. The simulation gives a result that intense compressive stress is produced both in the X direction and in the Y direction in almost all the areas while no stress is produced in the Z direction in almost all the areas in the chip. According to the foregoing, it is concluded that in a resistance element in the present embodiment, resistance does not fluctuate between before and after packaging.

Figure 10:
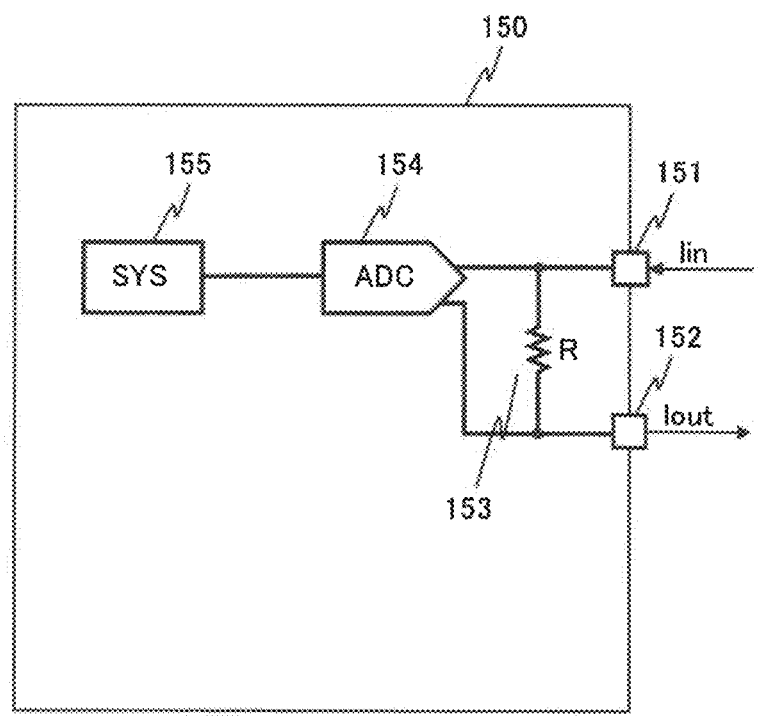
FIG. 10 illustrates a linear solenoid drive circuit.

Up to this point, a concrete description has been given to an embodiment of the invention made by the present inventors. However, the present invention is not limited to the above embodiment and may be variously modified without departing from the subject matter thereof, needless to add. For example, an application of a resistance element in the present embodiment is not limited to an oscillation circuit and the resistance element is also applicable to a semiconductor device 150 equipped with a linear solenoid drive circuit illustrated in FIG. 10. An inductor, not shown, is coupled between a terminal 151 and a terminal 152 of the semiconductor device 150. By passing a current through the inductor, a magnetic field corresponding to a magnitude of the current is generated. At this time, the current passed through the inductor is monitored by a voltage generated across a resistor 153. For this purpose, the voltage across the resistor 153 is detected with an A/D converter 154 and fed back to a control circuit 155. A trimming circuit using a resistance element in the present embodiment is also applicable to the resistor 153 and thus a current passed through the inductor can be precisely controlled.

DESCRIPTION OF REFERENCE NUMERALS

1: Semiconductor device
2: CPU
3: RAM
4: Peripheral IP
5: Nonvolatile memory
6: Register
7: Clock generation circuit
8: On-chip oscillator
9: Resistor
10: Bus
20: Trimming circuit
21: Constant-current generation circuit
22, 23: Capacitor
24, 25: Capacitance drive circuit
26, 27: Comparator
28: Latch circuit
51: Lower conductive layer
52: Upper conductive layer
53: Interlayer conductive layer
91: Resistance element

What is claimed is:
1. A semiconductor device comprising:
a semiconductor substrate; and
a plurality of wiring layers formed over the semiconductor substrate and including at least a first wiring layer and a second wiring layer,
wherein a resistance element is formed in the wiring layers, and
wherein the resistance element has a repetitive pattern of a first conductive layer formed in the first wiring layer, a second conductive layer formed in the second wiring layer, and an interlayer conductive layer coupling the first conductive layer and the second conductive layer together,
wherein a resistance value of the interlayer conductive layer is greater than the sum of a resistance value of the first conductive layer and a resistance value of the second conductive layer.
2. The semiconductor device according to claim 1, wherein the interlayer conductive layer includes a metal layer or a polysilicon layer formed between the first conductive layer and the second conductive layer.
3. The semiconductor device according to claim 1, wherein the wiring layers include a third wiring layer between the first wiring layer and the second wiring layer, and
wherein the interlayer conductive layer includes a landing PAD formed in the third wiring layer, a first via coupling the first conductive layer and the landing PAD together, and a second via coupling the second conductive layer and the landing PAD together.
4. The semiconductor device according to claim 3, wherein in the first via and the second via, a buried layer obtained by burying a W layer in a TiN layer is formed.

5. The semiconductor device according to claim 1,
wherein in the first wiring layer, the lengthwise direction of the first conductive layer is taken as a first direction and a direction perpendicular to the first direction is taken as a second direction, and
wherein a plurality of the interlayer conductive layers included in the resistance element are arranged in a matrix pattern in the first direction and the second direction.

6. The semiconductor device according to claim 5,
wherein the interlayer conductive layers included in the resistance element and adjoining to each other are disposed with a minimum interval of vias in the semiconductor device.

7. The semiconductor device according to claim 1, comprising:
a trimming circuit using a plurality of the resistance elements.

8. A semiconductor device comprising:
a semiconductor substrate;
a plurality of wiring layers formed over the semiconductor substrate, and
a trimming circuit including resistance elements formed in the wiring layers,
wherein the wiring layers include at least a first wiring layer and a second wiring layer, and
wherein the resistance element includes a repetitive pattern of a first conductive layer formed in the first wiring layer, a second conductive layer formed in the second wiring layer, and an interlayer conductive layer coupling the first conductive layer and the second conductive layer together,
wherein a resistance value of the interlayer conductive layer is greater than the sum of a resistance value of the first conductive layer and a resistance value of the second conductive layer.

9. The semiconductor device according to claim 8,
wherein the trimming circuit includes a plurality of the resistance elements coupled in series and a switch coupled in parallel with each of the resistance elements.

10. The semiconductor device according to claim 8,
wherein the interlayer conductive layer includes a metal layer or a polysilicon layer formed between the first conductive layer and the second conductive layer.

11. The semiconductor device according to claim 8,
wherein the wiring layers include a third wiring layer between the first wiring layer and the second wiring layer, and
wherein the interlayer conductive layer includes a landing PAD formed in the third wiring layer, a first via coupling the first conductive layer and the landing PAD together, and a second via coupling the second conductive layer and the landing PAD together.

12. The semiconductor device according to claim 8,
wherein in the first wiring layer, the lengthwise direction of the first conductive layer is taken as a first direction and a direction perpendicular to the first direction is taken as a second direction, and
wherein a plurality of the interlayer conductive layers included in the resistance element are arranged in a matrix pattern in the first direction and the second direction.

13. The semiconductor device according to claim 12,
wherein the interlayer conductive layers included in the resistance element and adjoining to each other are arranged with a minimum interval of vias in the semiconductor device.

14. The semiconductor device according to claim 1,
wherein the plurality of wiring layers and has a main resistance in a direction perpendicular to a plane of the semiconductor substrate where a semiconductor element is formed.

15. The semiconductor device according to claim 1,
wherein the interlayer conductive layer is formed perpendicular with the first conductive layer, the second conductive layer, and a plane of the semiconductor substrate.

16. A semiconductor device comprising:
a semiconductor substrate; and
a plurality of wiring layers formed over the semiconductor substrate and including at least a first wiring layer and a second wiring layer,
wherein a resistance element is formed in the wiring layers,
wherein the resistance element includes a first conductive layer formed in the first wiring layer, a second conductive layer formed in the second wiring layer, and an interlayer conductive layer coupling the first conductive layer and the second conductive layer together, and
wherein a resistance value of the interlayer conductive layer is greater than the sum of a resistance value of the first conductive layer and a resistance value of the second conductive layer.

17. The semiconductor device according to claim 16,
wherein the plurality of wiring layers and has a main resistance in a direction perpendicular to a plane of the semiconductor substrate where a semiconductor element is formed.

18. The semiconductor device according to claim 16,
wherein the interlayer conductive layer includes a metal layer or a polysilicon layer formed between the first conductive layer and the second conductive layer, and
wherein the interlayer conductive layer is formed perpendicular with the first conductive layer, the second conductive layer, and a plane of the semiconductor substrate.

* * * * *